(12) United States Patent
Hinoue et al.

(10) Patent No.: US 7,067,889 B2
(45) Date of Patent: Jun. 27, 2006

(54) METHOD FOR MANUFACTURING SEMICONDUCTOR INTEGRATED CIRCUIT DEVICE

(75) Inventors: Tatsuya Hinoue, Odawara (JP); Fumitoshi Ito, Hamura (JP); Shiro Kamohara, Hachioji (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/355,302

(22) Filed: Jan. 31, 2003

(65) Prior Publication Data

US 2003/0141557 A1 Jul. 31, 2003

Related U.S. Application Data

(62) Division of application No. 10/280,019, filed on Oct. 25, 2002, now Pat. No. 6,734,114.

(30) Foreign Application Priority Data

Nov. 15, 2001 (JP) ......................................... 2001-349543

(51) Int. Cl.
*H01L 31/119* (2006.01)
*H01L 31/113* (2006.01)

(52) U.S. Cl. ..................... 257/391; 257/389; 257/410; 257/411; 257/351

(58) Field of Classification Search ................ 257/389, 257/410, 411, 351, 391, 392, 395, 406, 412; 438/216, 261, 421, 591, 595
See application file for complete search history.

(56) References Cited

U.S. PATENT DOCUMENTS 6,184,143 B1 * 2/2001 Ohashi et al. ............... 438/697
6,383,921 B1 * 5/2002 Chan et al. .................. 438/649
6,445,033 B1 * 9/2002 Hasegawa ................... 257/324
6,483,151 B1 * 11/2002 Wakabayashi et al. ...... 257/369

(Continued)

FOREIGN PATENT DOCUMENTS

| JP | 05-082740 | 4/1993 |
|---|---|---|
| JP | 7-94716 | 4/1995 |
| JP | 07-142726 | 6/1995 |
| JP | 11-67932 | * 3/1999 |
| JP | 2000-188338 | 7/2000 |
| JP | 2000-349285 | 12/2000 |
| JP | 2001-007330 | 1/2001 |
| JP | 2001-1769893 | 6/2001 |

OTHER PUBLICATIONS

Kaushik et al, Device Characteristics of Crystalline Epitaxial Oxides on Silicon, Device research Conference, 2000. Confernce Digest. 58th DRC, 2000.*
Japanese Office Action, dated Jun. 9, 2005 (4 pp.), for No. 2001-349543.

*Primary Examiner*—Jerome Jackson
*Assistant Examiner*—Joseph Nguyen
(74) *Attorney, Agent, or Firm*—Antonelli, Terry, Stout and Kraus, LLP.

(57) ABSTRACT

A two-type gate process is suitable for forming a gate insulation film partially formed of a high dielectric film, for example, a titanium oxide film (gate insulation film of the internal circuit) having a relative dielectric constant larger than that of silicon nitride on a substrate, and a silicon nitride film is deposited on the titanium oxide film. The silicon nitride film will prevent oxidation of the titanium oxide film when the surface of the substrate is subjected to thermal oxidation in the next process step. Next, the silicon nitride film and the titanium oxide film on the I/O circuit region are removed, while the silicon nitride film and the titanium oxide film on the internal circuit region remain, and the substrate is subjected to thermal oxidation to form a silicon oxide film as a gate insulation film on the surface of the I/O circuit region.

27 Claims, 13 Drawing Sheets

U.S. PATENT DOCUMENTS 6,501,140 B1 * 12/2002 Honeycutt et al. .......... 257/411
6,518,631 B1 *  2/2003 En et al. .................... 257/382
6,597,046 B1 *  7/2003 Chau et al. ................. 257/411
2003/0132500 A1 *  7/2003 Jones, Jr. et al. ........... 257/500
2004/0070036 A1 *  4/2004 Setton ........................ 257/410
2004/0152340 A1     8/2004 Yamamoto et al.

* cited by examiner

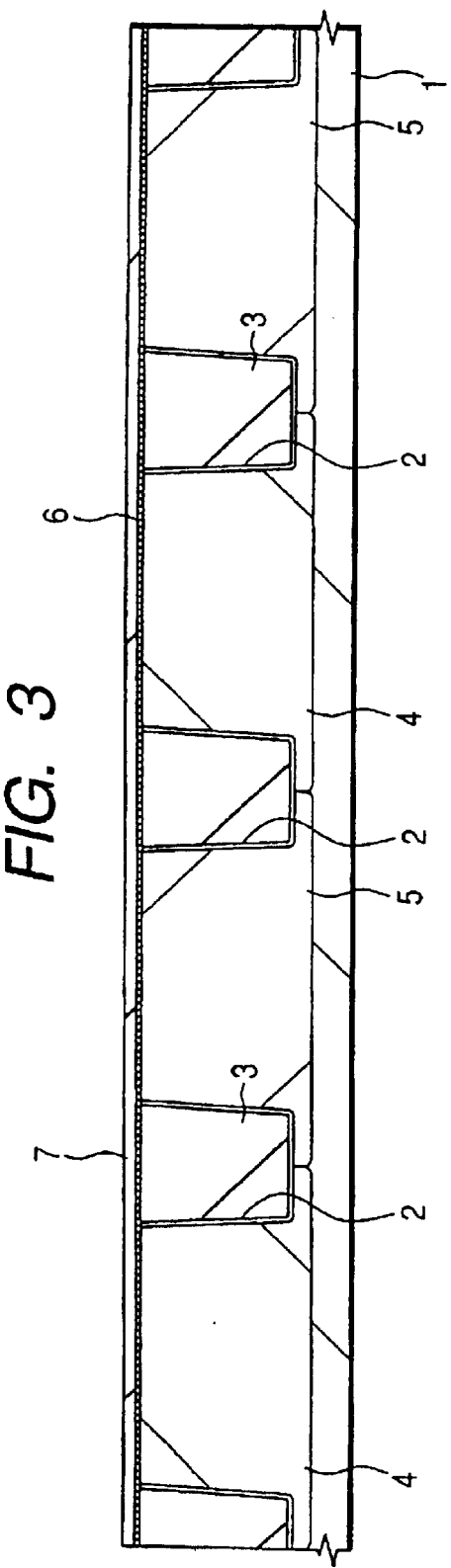
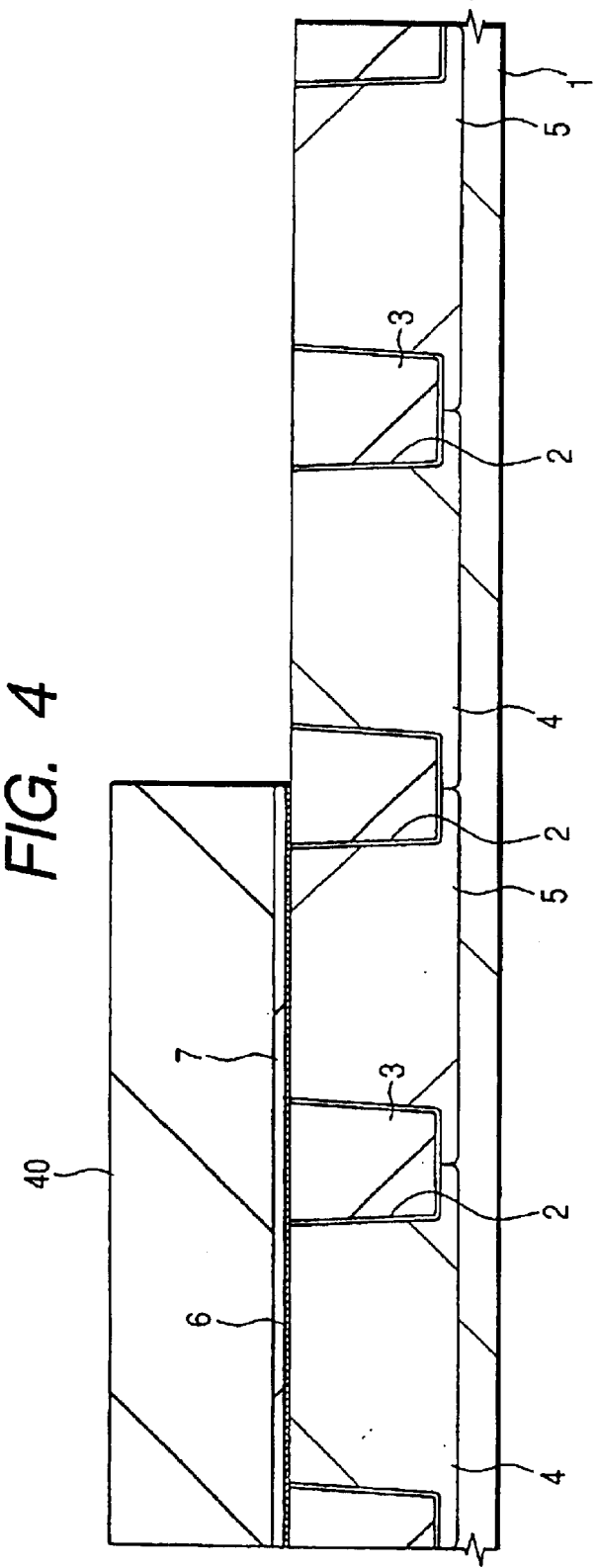

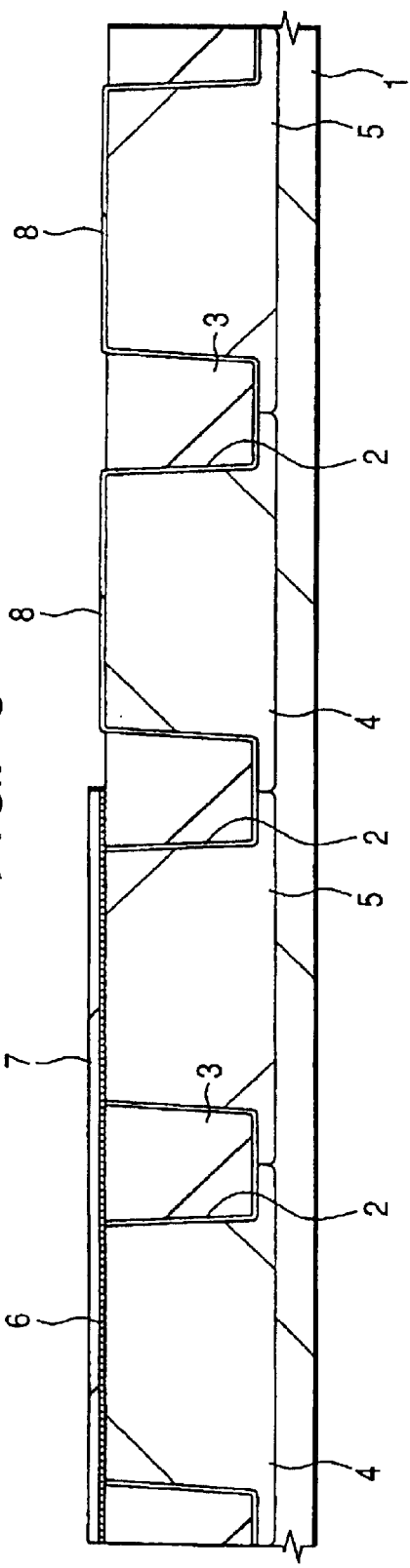
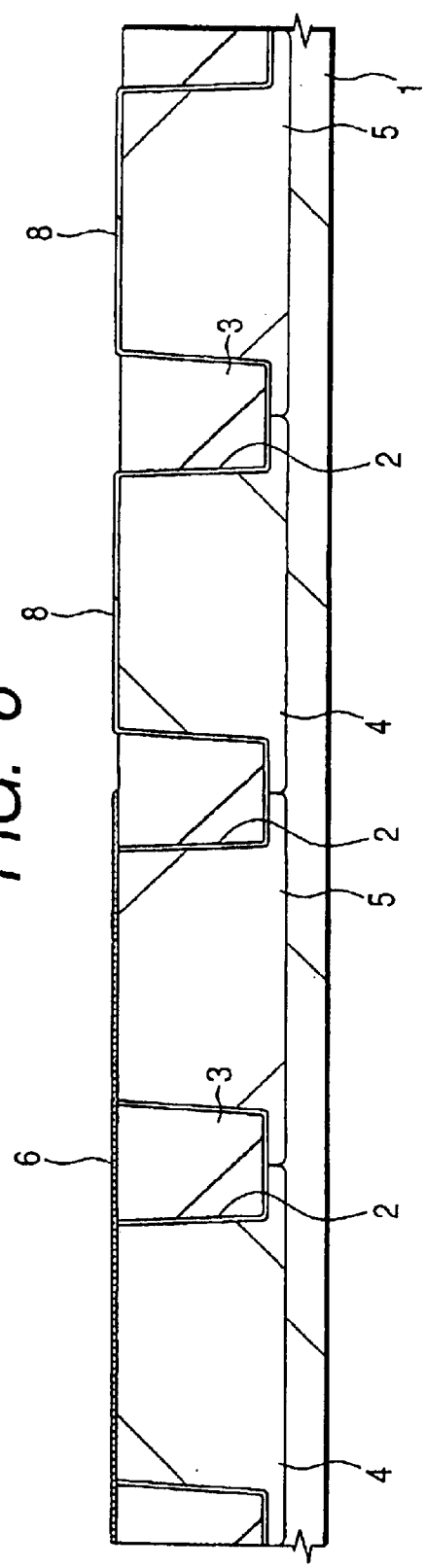

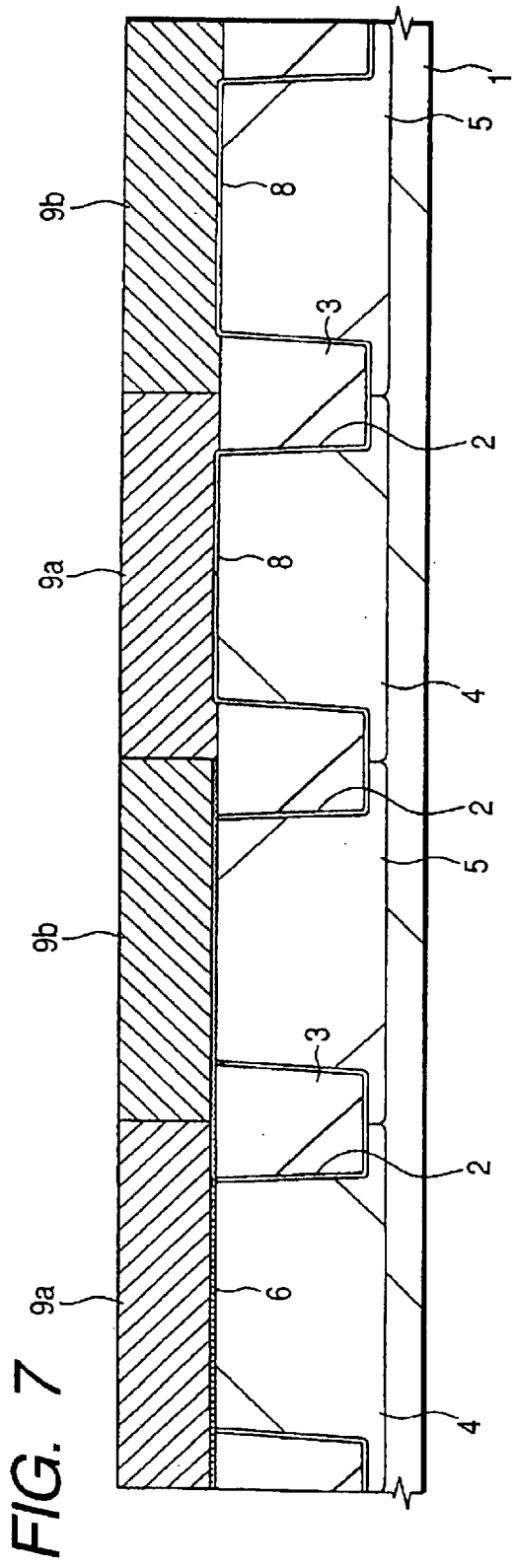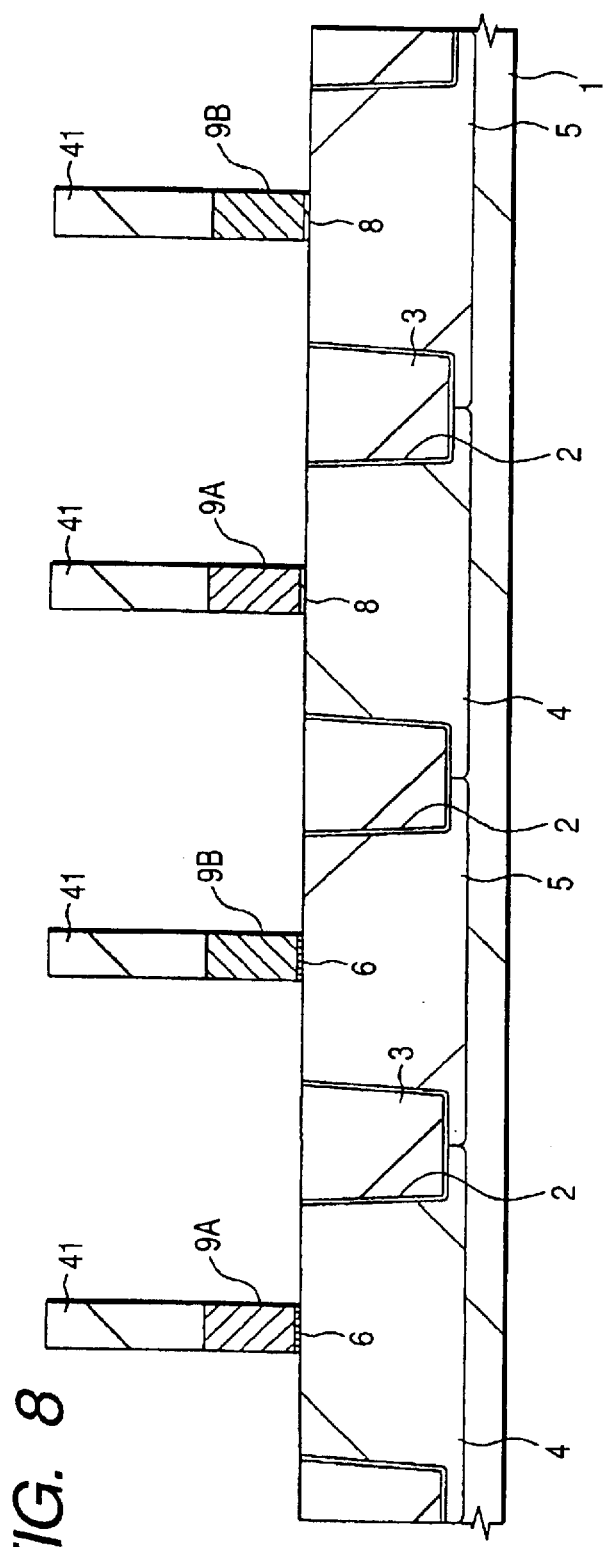

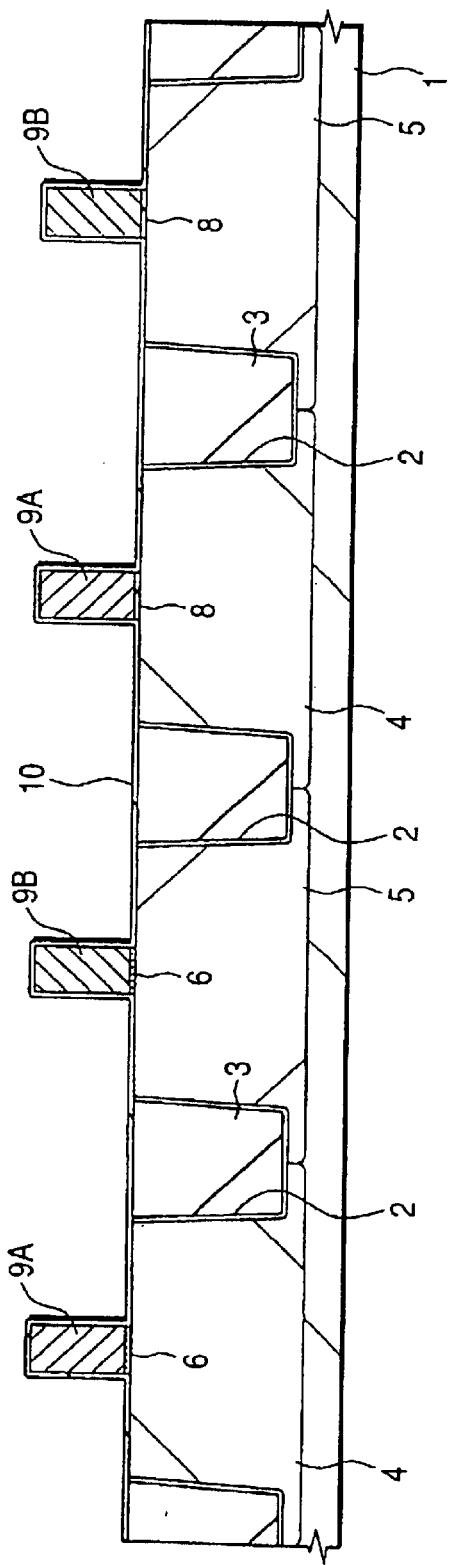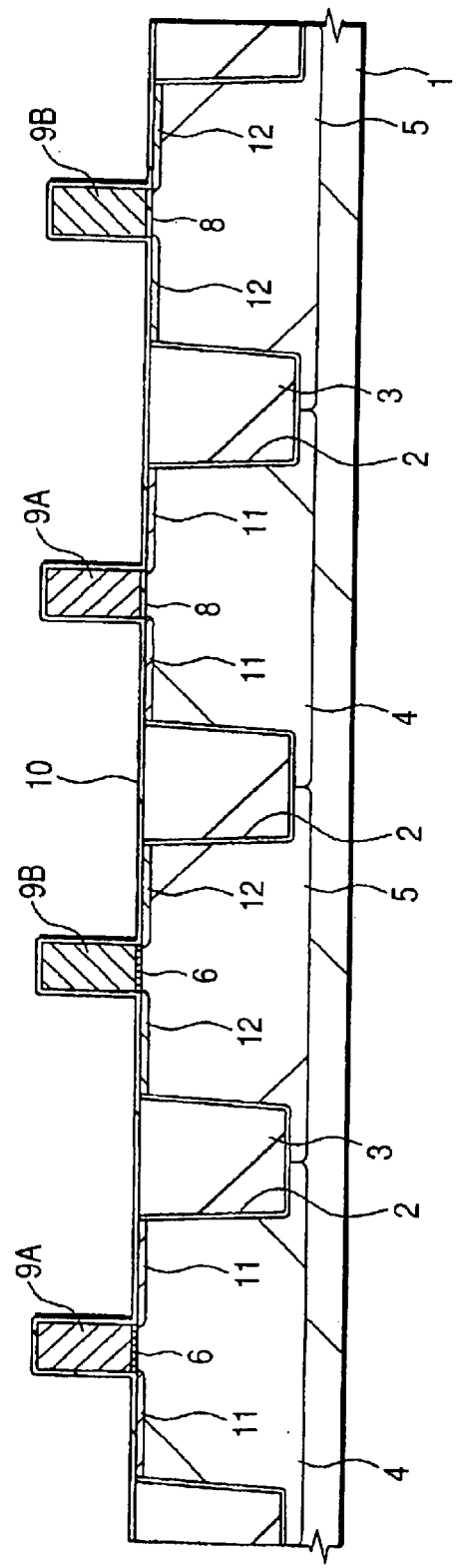

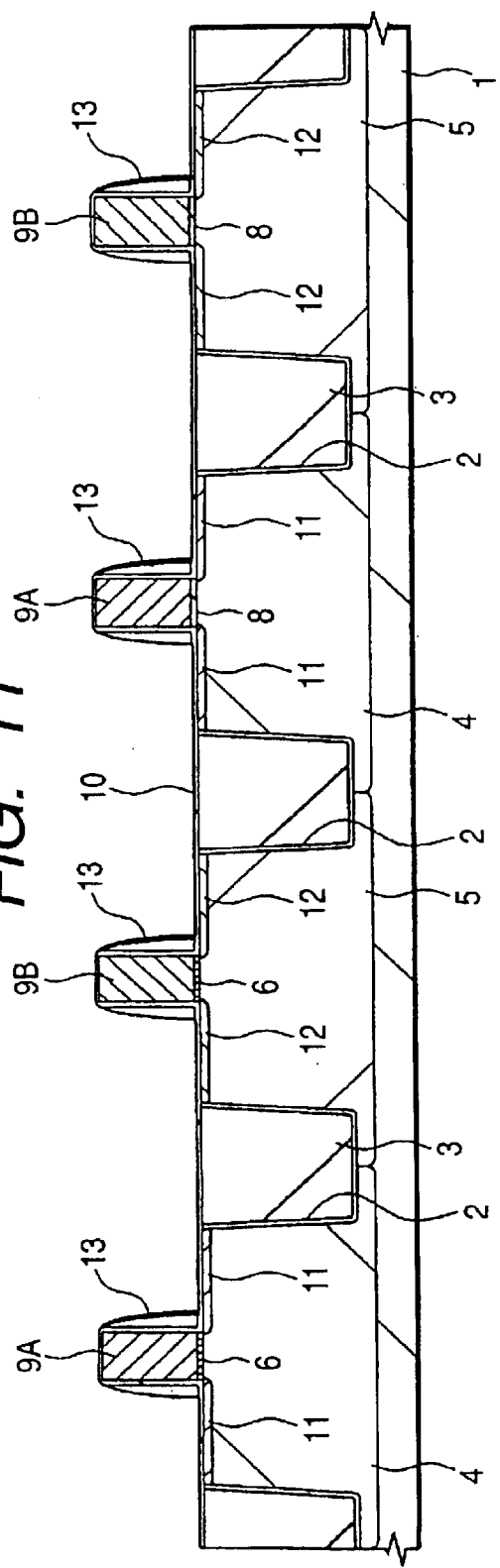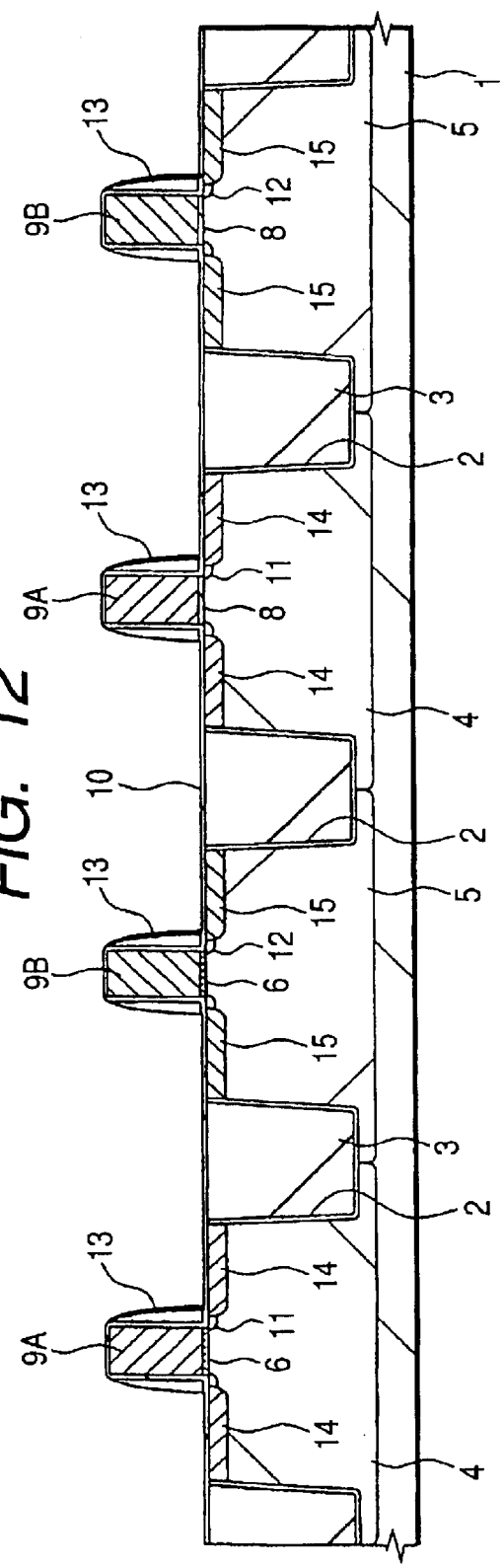

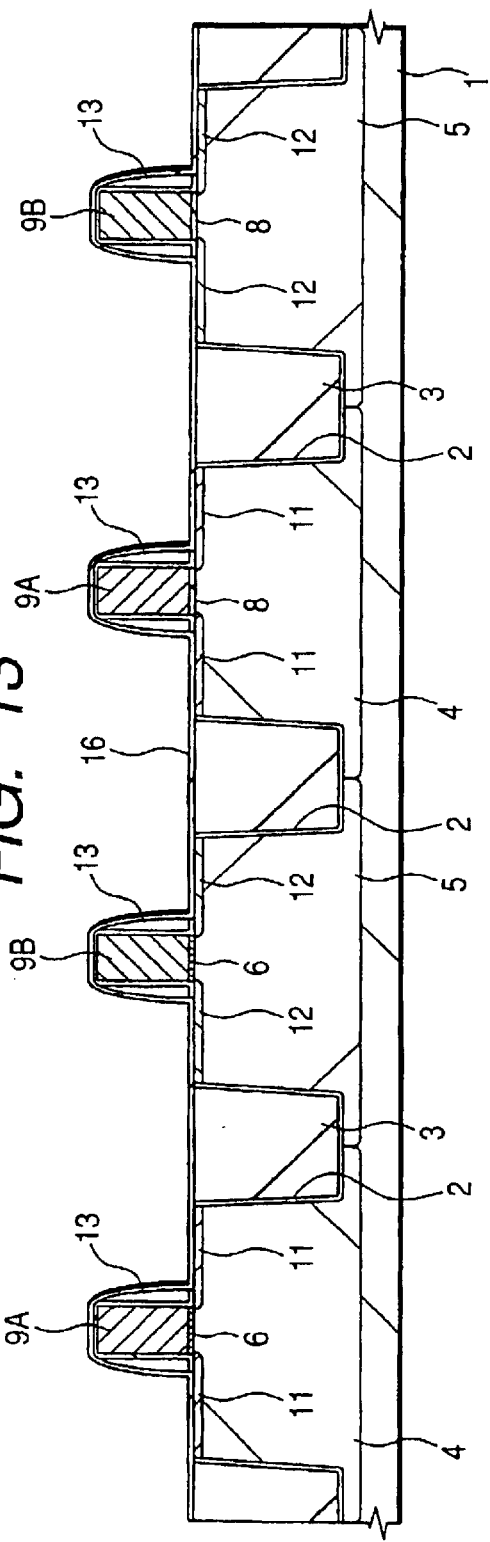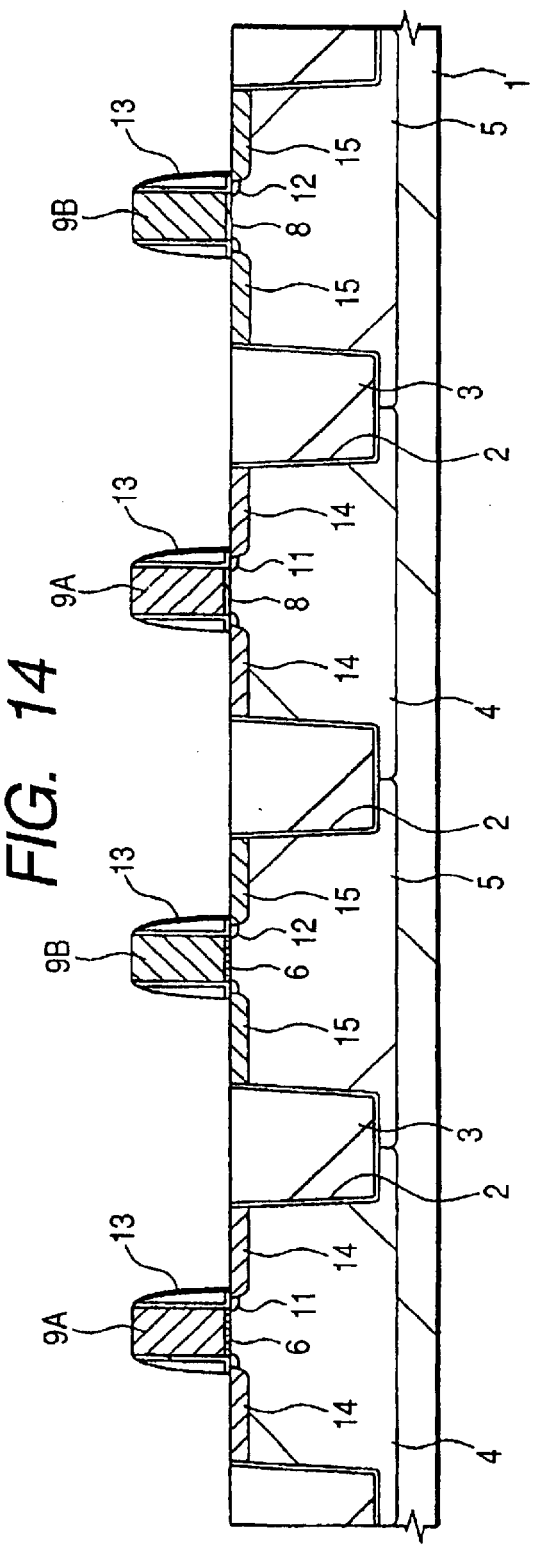

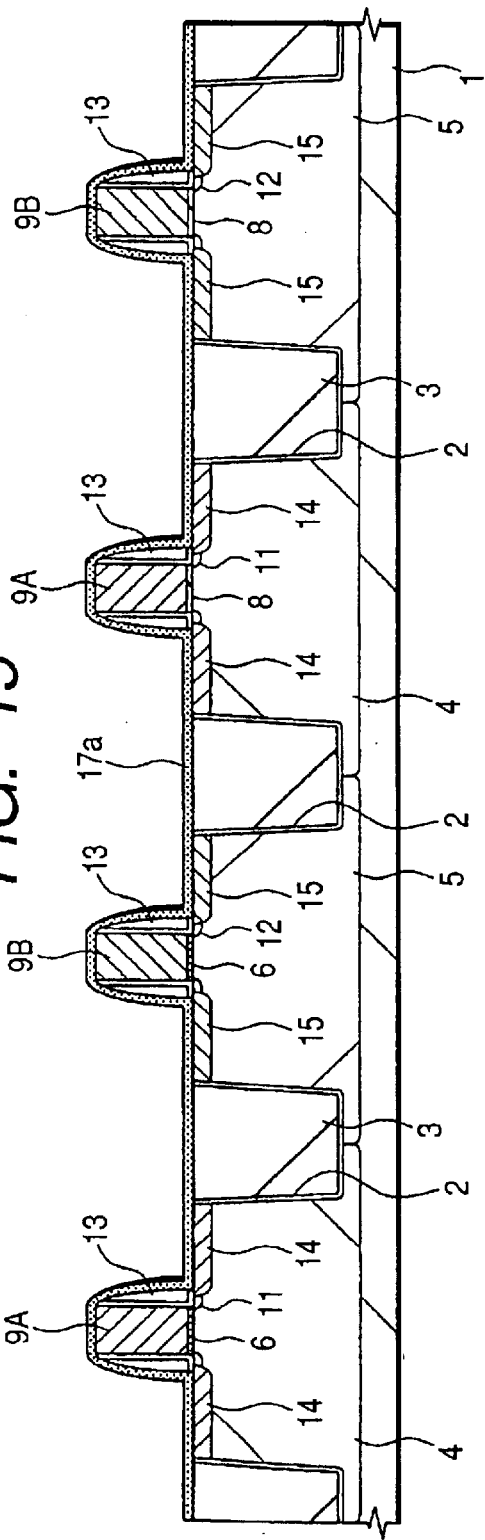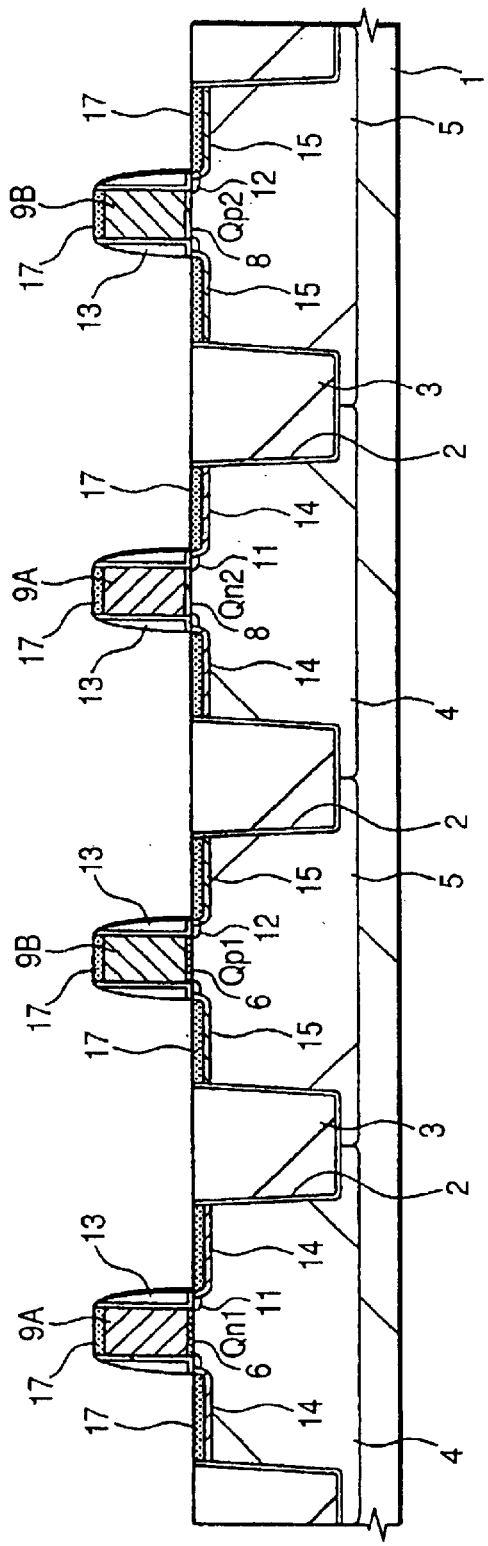

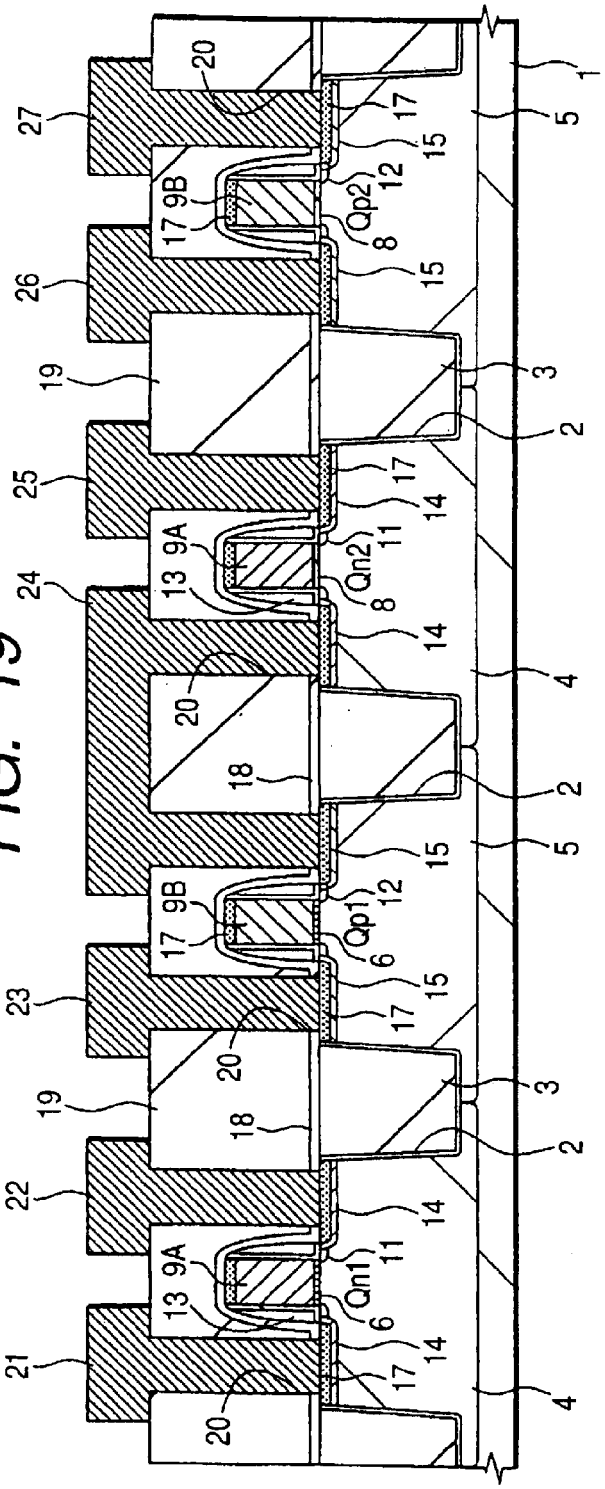
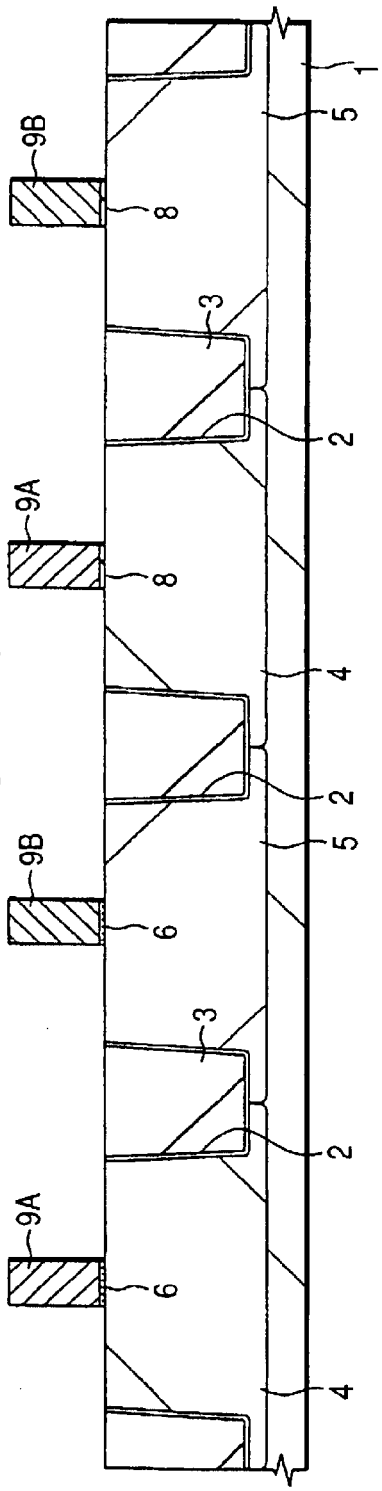

METHOD FOR MANUFACTURING SEMICONDUCTOR INTEGRATED CIRCUIT DEVICE

This application is a Divisional application of application Ser. No. 10/280,019, filed Oct. 25, 2002 now U.S. Pat. No. 6,734,114, the contents of which are incorporated herein by reference in their entirety.

BACKGROUND OF THE INVENTION

The present invention relates in general to semiconductor integrated circuit devices and to a method for manufacturing such semiconductor integrated circuit devices; and, more particularly, the invention relates to a technique that is effective applied to a semiconductor integrated circuit device provided with two or more MISFET's (Metal Insulator Semiconductor Field Effect Transistor) having gate insulation films that are different in film thickness on the same semiconductor substrate.

In the field of semiconductor device technology, a so-called two-type gate process, in which a gate insulation film having a thin film thickness and a gate insulation film having a thick film thickness are formed in the same semiconductor chip, has been used in practice concomitantly with the popularization of a semiconductor chip having multi-power sources.

For example, Japanese Published Unexamined Patent Application No. 2000-188338 discloses a two-type gate process in which a gate insulation film comprised of silicon oxide and a gate insulation film comprised of silicon nitride are formed on a first region and a second region of a semiconductor substrate, respectively.

In the two-type gate process described in the above-mentioned Patent Application, at first, a first silicon oxide film is formed on first and second regions of a semiconductor substrate, and then the first silicon oxide film on the first region is removed selectively by etching to expose the first region of the semiconductor substrate surface.

Next, a silicon nitride film is formed on the first region of the semiconductor substrate and on the first silicon oxide film on the second region, and then the second silicon nitride film and the first silicon oxide film are removed selectively by etching to expose the second region of the semiconductor substrate surface.

Next, the semiconductor substrate is subjected to thermal oxidation to form a second silicon oxide film on the second region of the semiconductor substrate surface. Thereby, the first gate insulation film comprised of silicon nitride is formed on the first region of the semiconductor substrate surface and the second gate insulation film comprised of silicon oxide is formed on the second region of the semiconductor substrate surface.

SUMMARY OF THE INVENTION

A thinner gate insulation film is required in proportion to the miniaturization of a MISFET in order to realize a low voltage operation of the MISFET. For example, a gate insulation film having a film thickness converted to that of a silicon film as thin as about 3 nm is required for a MISFET having a gate length of 0.2 μm or shorter. However, a gate insulation film having a film thickness of 3 nm or thinner, consisting of silicon oxide, causes an increased direct tunnel current that flows through the gate insulation film, and the gate leakage current is significantly too large to ignore from the view point of reduction in power consumption.

To solve the above-mentioned problems, a countermeasure could be adopted in which a high dielectric film, such as a titanium oxide ($TiO_2$) or tantalum oxide ($Ta_2O_5$) film having a relative dielectric constant larger than that of silicon oxide is used, to thereby increase the physical film thickness of a gate insulation film. Herein, it is required essentially to employ a process in which a part of a gate insulation film is formed of a high dielectric film, and the other part is formed of a silicon oxide film in the above-mentioned two-type gate process.

Furthermore, in the conventional gate forming process, in which a gate insulation film is formed of a silicon oxide film, when a gate electrode is formed by means of dry etching using a photoresist film as a mask, a semiconductor substrate is subjected to thermal oxidation, namely light oxidation, just after the gate electrode is formed, so as to improve the low withstand voltage of the gate electrode due to an undercut arising from isotropic etching of the gate oxide film of the sidewall end of the gate electrode. (For example, see Japanese Published Unexamined Patent Application No. Hei 7(1995)-94716).

However, when the gate insulation film formed of a high dielectric film is subjected to light oxidation after the gate electrode has been formed, the interface between the high dielectric film and the semiconductor substrate is oxidized and a silicon oxide film is formed. As a result, the dielectric constant of the gate insulation film decreases, and this decrease causes a problem. Therefore, it is not possible to improve the profile of the gate electrode sidewall end by means of light oxidation in this case.

It is an object of the present invention to provide a two-type gate process in which a gate insulation film is partially formed of a high dielectric film.

It is another object of the present invention to provide a technique for securing the reliability of an MISFET having a gate insulation film formed of a high dielectric substance.

The above-mentioned and other objects and novel features of the present invention will be apparent from the following description and the attached drawings.

An outline of typical aspects of the invention disclosed in the present application will be described hereunder.

A method of manufacturing a semiconductor circuit device of the present invention includes the steps of: (a) forming a first insulation film having a relative dielectric constant higher than that of silicon nitride on the main surface of a semiconductor substrate followed by forming an oxidation prevention film on the first insulation film; (b) covering the oxidation prevention film on a first region of the semiconductor substrate, and etching the oxidation prevention film and the first insulation film on a second region of the semiconductor substrate, to thereby expose the semiconductor substrate surface of the second region; (c) after step (b), subjecting the semiconductor substrate to thermal oxidation to thereby form a second insulation film consisting of silicon oxide on the semiconductor substrate surface of the second region; and (d) forming a gate electrode of a first MISFET on the first insulation film of the first region and a gate electrode of a second MISFET on the second insulation film of the second region, after the oxidation prevention film on the first region is removed.

The method of manufacturing a semiconductor integrated circuit device of the present invention additionally includes the step (e) of thinning the respective gate electrodes of the first and second MISFET's to thereby narrow the width of the gate electrode to a width narrower than that of the gate insulation film located under the gate electrode after the step (d).

A semiconductor integrated circuit device of the present invention has a first MISFET on a first region of the main surface of a semiconductor substrate and a second MISFET on a second region of the main surface of the semiconductor substrate, wherein a gate insulation film of the first MISFET comprises a first insulation film having a relative dielectric constant higher than that of silicon nitride, wherein a gate insulation film of the second MISFET comprises a second insulation film consisting of silicon oxide, and wherein the film thickness converted to that of a silicon oxide film of the first insulation film is thinner than the film thickness converted to that of a silicon oxide film of the second insulation film.

In the semiconductor integrated circuit device of the present invention, the film thickness converted to that of a silicon oxide film of the first insulation film is thinner than 3 nm, and the film thickness converted to that of a silicon oxide film of the second insulation film is equal to or thicker than 3 nm.

In the semiconductor integrated circuit device of the present invention, the first insulation film consists of an oxide of a 4A group element.

In the semiconductor integrated circuit device of the present invention, a sidewall spacer comprising a silicon nitride film or silicon oxide film and a silicon nitride film that covers the sidewall spacer are formed on the sidewall of a gate electrode of the first MISFET.

BRIEF DESCRIPTION OF THE DRAWINGS

FIG. 3 is a partial cross-sectional view of the semiconductor substrate showing a subsequent step of the method of manufacture of the MISFET in accordance with one embodiment of the present invention;

FIG. 4 is a partial cross-sectional view of the semiconductor substrate showing a subsequent step of the method of manufacture of the MISFET in accordance with one embodiment of the present invention;

FIG. 5 is a partial cross-sectional view of the semiconductor substrate showing a subsequent step of the method of manufacture of the MISFET in accordance with one embodiment of the present invention;

FIG. 6 is a partial cross-sectional view of the semiconductor substrate showing a subsequent step of the method of manufacture of the MISFET in accordance with one embodiment of the present invention;

FIG. 7 is a partial cross-sectional view of the semiconductor substrate showing a subsequent step of the method of manufacture of the MISFET in accordance with one embodiment of the present invention;

FIG. 8 is a partial cross-sectional view of the semiconductor substrate showing a subsequent step of the method of manufacture of the MISFET in accordance with one embodiment of the present invention;

FIG. 9 is a partial cross-sectional view of the semiconductor substrate showing a subsequent step of the method of manufacture of the MISFET in accordance with one embodiment of the present invention;

FIG. 10 is a partial cross-sectional view of the semiconductor substrate showing a subsequent step of the method of manufacture of the MISFET in accordance with one embodiment of the present invention;

FIG. 11 is a partial cross-sectional view of the semiconductor substrate showing a subsequent step of the method of manufacture of the MISFET in accordance with one embodiment of the present invention;

FIG. 12 is a partial cross-sectional view of the semiconductor substrate showing a subsequent step of the method of manufacture of the MISFET in accordance with one embodiment of the present invention;

FIG. 13 is a partial cross-sectional view of the semiconductor substrate showing a subsequent step of the method of manufacture of the MISFET in accordance with one embodiment of the present invention;

FIG. 14 is a partial cross-sectional view of the semiconductor substrate showing a subsequent step of the method of manufacture of the MISFET in accordance with one embodiment of the present invention;

FIG. 15 is a partial cross-sectional view of the semiconductor substrate showing a subsequent step of the method of manufacture of the MISFET in accordance with one embodiment of the present invention;

FIG. 16 is a partial cross-sectional view of the semiconductor substrate showing a subsequent step of the method of manufacture of the MISFET in accordance with one embodiment of the present invention;

FIG. 19 is a partial cross-sectional view of the semiconductor substrate showing a subsequent step of the method of manufacture of the MISFET in accordance with one embodiment of the present invention;

FIG. 20 is a partial cross-sectional view of the semiconductor substrate showing a step of the method of manufacture of the MISFET in accordance with a second embodiment of the present invention;

DETAILED DESCRIPTION OF THE PREFERRED EMBODIMENTS

Embodiments of the present invention will be described in detail hereinafter with reference to the drawings. Those members having the same functions have been identified by the same characters in all of the drawings, and a repeated description thereof is omitted. The description of the same or similar members is not repeated, unless it is required, in the embodiments described hereinafter.

(Embodiment 1)

An MISFET of a CMOS-LSI of the internal circuit of the present embodiment is operated using a low voltage from the view point of conservation of the circuit power consumption. To achieve such a power saving, a thin gate insulation film, which forms part of the MISFET of the internal circuit, having a film thickness, that is, a film thickness converted to that of a silicon oxide film, which is thinner than 3 nm, is used. On the other hand, an MISFET of the input/output (I/O) circuit, on which an external high voltage is applied, is formed of a thick insulation film having a film thickness, that is, a film thickness converted to that of a silicon oxide film, of 3 nm or thicker, because it is required to secure a high gate withstand voltage.

In this case, if the gate insulation film of the MISFET of the internal circuit is formed of a silicon oxide film, the direct tunnel current that flows through the thin gate insulation film increases so as to cause a gate leakage current that is too large to ignore, from the view point of conservation of the power consumption. Therefore, the gate insulation film of the MISFET of the internal circuit is formed of a high dielectric film having a physical thickness greater than 3 nm, even though the thickness converted to the thickness of a silicon oxide film is thinner than 3 nm in the present embodiment. In detail, the gate insulation film is formed of an insulation film having a relative dielectric constant that is larger than that of a silicon nitride film (relative dielectric constant=7 to 8). On the other hand, the gate insulation film of the MISFET of the I/O circuit is formed of silicon oxide to secure the required reliability during high voltage operation.

A method of manufacturing the CMOS-LSI of the present embodiment will be described with reference to FIG. 1 to FIG. 19 in the order of the successive steps thereof. In FIG. 1 to FIG. 19, the left side region of a semiconductor substrate represents the internal circuit region, and the right side region represents the I/O circuit region.

Figure 1:
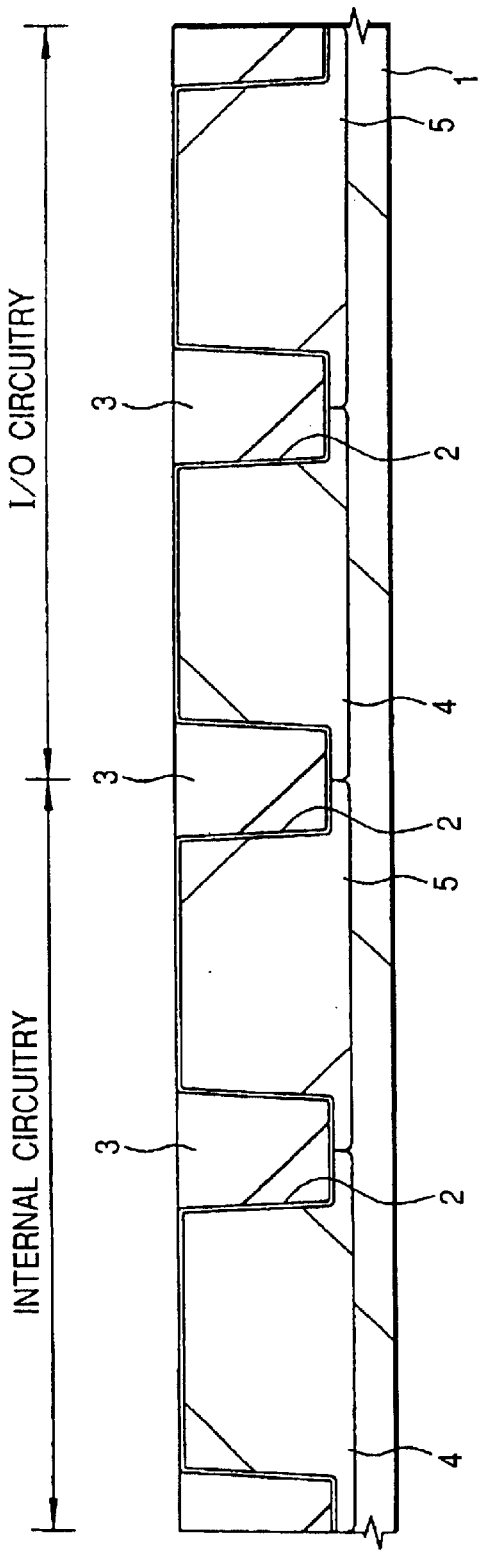
FIG. 1 is a partial cross-sectional view of a semiconductor substrate showing a step of the method of manufacture of an MISFET in accordance with one embodiment of the present invention.

At first, as shown in FIG. 1, element separation grooves 2 are formed on the semiconductor substrate (simply referred to as a substrate hereinafter) 1 consisting of p-type single crystal silicon having a specific resistance of, for example, 1 to 10 Ωcm. To form the element separation grooves, the element separation regions of the substrate 1 are etched to form grooves, a silicon oxide film 3 is deposited on the substrate 1 including the inside of the grooves by means of a CVD technique, and the silicon oxide film 3 deposited outside the grooves is subjected to chemical mechanical polishing and removed. Next, boron is ion-implanted into a part of the substrate to form p-type wells 4, and phosphor is ion-implanted into another part of the substrate to form n-type wells 5.

Figure 2:
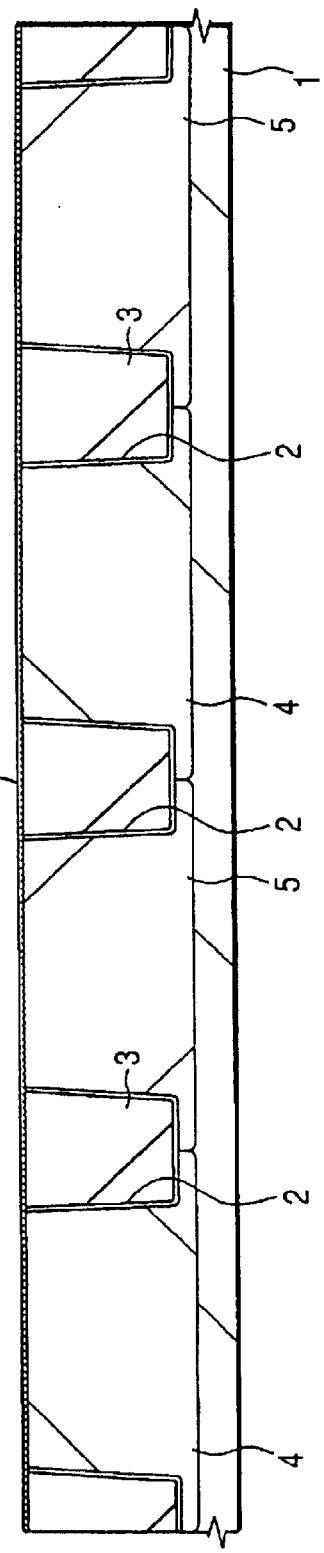
FIG. 2 is a partial cross-sectional view of the semiconductor substrate showing a subsequent step of the method of manufacture of the MISFET in accordance with one embodiment of the present invention.

Next, the surface of the substrate 1 is washed with hydrofluoric acid to remove the natural oxide film, and a high dielectric film 6, having a relative dielectric constant larger than that of a silicon nitride film, for example, a titanium oxide ($TiO_2$) film, is deposited on the substrate 1, as shown in FIG. 2. The titanium oxide film 6 is deposited so as to have a film thickness converted to that of a silicon oxide film thinner than 3 nm.

As the material of the high dielectric film having a larger relative dielectric constant than that of a silicon nitride film, oxides of a 4A group element, such as zirconium oxide ($ZrO_2$) and hafnium oxide ($HfO_2$), and tantalum oxide ($Ta_2O_5$) may be used, in addition to the above-mentioned titanium oxide film 6. It is desirable to deposit the metal oxide film by means of a CVD technique using an organometal source gas to reduce damage to the substrate 1 during film forming.

Next, a silicon nitride film 7 is deposited on the titanium oxide film 6, as shown in FIG. 3. The silicon nitride film 7 functions as an oxidation prevention film that prevents the substrate 1 of the internal circuit region from being oxidized when the surface of the substrate 1 of the I/O circuit region is subjected to thermal oxidation in the next step.

Next, as shown in FIG. 4, the silicon nitride film 7 of the internal circuit region is covered with a photoresist film 40, and the silicon nitride film 7 and the titanium oxide film 6 on the I/O circuit region are removed by dry-etching using the photoresist film 40 as a mask, thereby to expose the surface of the substrate 1 (p-type well 4 and n-type well 5) of the I/O circuit region. The titanium oxide film 6 that remains on the surface of the substrate 1 of the internal circuit region is used as a gate insulation film of an MISFET, that is a component of the internal circuit.

Next, the photoresist film 40 is removed by use of an ashing technique, and the surface of the substrate 1 is washed with hydrofluoric acid. Thereafter, a silicon oxide film 8 is formed on the surface of the substrate 1 (p-type well 4 and n-type well 5) of the I/O circuit region by thermal oxidation of the substrate 1, as shown in FIG. 5. The silicon oxide film 8 is used as a gate insulation film of an MISFET, that is a component of the I/O circuit. The silicon oxide film 8 is formed so as to have a film thickness of 3 nm or greater to secure the reliability of the MISFET, that is a component of the I/O circuit. On the other hand, the film thickness converted to that of a silicon oxide film of the gate insulation film formed on the internal circuit region will not exceed 3 nm, because the surface of the substrate 1 of the internal circuit region that is covered with silicon nitride film 7 is not oxidized during the above-mentioned thermal oxidation step.

Next, as shown in FIG. 6, the silicon nitride film 7, that covers the titanium oxide film 6 on the internal circuit region, is removed with hot phosphoric acid. Through the above-mentioned steps, the first gate insulation film (having a film thickness converted to that of a silicon oxide film thinner than 3 nm) consisting of the titanium oxide film 6 is formed on the surface of the substrate 1 (p-type well 4 and n-type well 5) of the internal circuit region, and the second gate insulation film (having a film thickness converted to that of a silicon oxide film of 3 nm or thicker) consisting of the silicon oxide film 8 is formed on the surface of the substrate 1 (p-type well 4 and n-type well 5) of the I/O circuit region.

Next, as shown in FIG. 7, an n-type polycrystalline silicon film 9a is formed on the p-well 4, and a p-type polycrystalline silicon film 9b is formed on the n-type well 5. To form these polycrystalline silicon films (9a and 9b), a non-doped polycrystalline silicon film is formed on the substrate 1 by use of a CVD technique, the polycrystalline silicon film on the p-type well 4 is doped with phosphor, and the polycrystalline silicon film on the n-type well 5 is doped with boron.

Next, as shown in FIG. 8, the n-type polycrystalline silicon film 9a and p-type polycrystalline silicon film 9b are subjected to dry-etching using a photoresist film 41 as a mask, to thereby form a gate electrode 9A consisting of the n-type polycrystalline silicon film 9a on the p-type well 4 and a gate electrode 9B consisting of the p-type polycrystalline silicon film 9b on the n-type well 5.

Dry-etching of the polycrystalline silicon films (9a and 9b) accompanies partial or complete dry-etching of the gate insulation films (titanium film 6 and silicon oxide film 8) formed on the region other than the region located under the gate electrodes 9A and 9B. As a result, the surface of the substrate 1 (p-type well 4 and n-type well 5) is exposed. Then, as shown in FIG. 9, the photoresist film 41 is removed using an ashing technique, the surface of the substrate 1 is washed with hydrofluoric acid, and a silicon nitride film 10 is deposited on the substrate 1 using a CVD technique. The silicon nitride film 10 will function to prevent pollution of the surface of the substrate when an impurity is ion-implanted into the substrate 1 in the next step. As the film for preventing pollution of the substrate 1, a silicon oxide film or the above-mentioned high dielectric film may be used instead of the silicon nitride film 10. If les of the gate insulation film (the titanium oxide film 6 and the silicon oxide film 8) is removed, the above-mentioned pollution prevention film may be omitted.

Next, as shown in FIG. 10, the p-type wells on both sides of the gate electrode 9A are ion-implanted with phosphor or arsenic to form $n^-$-type semiconductor regions 11 of low impurity concentration, and the n-type wells on both sides of the gate electrode 9B are ion-implanted with boron to form $p^-$-type semiconductor regions 12 of low impurity concentration. The $n^-$-type semiconductor region 11 is formed so that an n-channel type MISFET having a LDD (lightly doped drain) structure is formed, and the $p^-$-type semiconductor region 12 is formed so that the p-channel type MISFET having LDD structure is formed.

Next, as shown in FIG. 11, sidewall spacers 13 are formed on the sidewalls of the gate electrodes 9A and 9B. To form the sidewall spacers 13, a silicon nitride film is deposited on the substrate 1 using a CVD technique, and the silicon nitride film is etched anisotropically so as to remain on the sidewalls of the gate electrodes 9A and 9B. In the case where a contact hole, to be described hereinafter, is formed on the gate electrodes 9A and 9B without self-alignment, a sidewall spacer 13, consisting of a silicon oxide film, may be formed.

Next, as shown in FIG. 12, the p-type wells 4 on both sides of the gate electrode 9A are ion-implanted with phosphor or arsenic, and the n-type wells 5 on both sides of the gate electrode 9B are ion-implanted with boron. Thereafter, the substrate 1 is subjected to heat treatment to diffuse these impurities. Thereby, an $n^+$-type semiconductor region (source and drain) 14 of high impurity concentration is formed in the p-type well 4, and a $p^+$-type semiconductor region (source and drain) 15 of high impurity concentration is formed in the n-type well 5.

The substrate of the internal circuit region will not be oxidized during the heat treatment carried out to diffuse the impurity, because both sides of the gate electrodes 9A and 9B are covered with the pollution prevention silicon nitride film 10 and the sidewall spacers 13 consisting of silicon nitride.

Furthermore, anisotropic etching for forming the sidewall spacers 13 on the sidewalls of the gate electrodes 9A and 9B accompanied by partial or complete etching of the silicon nitride film 10 that covers the surface of the source and drain ($n^+$-type semiconductor region 14 and $p^+$-type semiconductor region 15), and the surface of the substrate (p-type well 4 and n-type well 5) is exposed in some cases.

In this case, as seen in FIG. 13, the sidewall spacer 13 is formed on the sidewalls of the gate electrodes 9A and 9B, a silicon nitride film 16 is deposited on the substrate 1 using a CVD technique, and ion-implantation is carried out to form the source and drain ($n^+$-type semiconductor region 14 and $p^+$-type semiconductor region 15). Thereby, pollution of the surface of the substrate 1 is prevented during the ion-implantation step.

Next, as shown in FIG. 14, the silicon nitride film 10, that covers the upper surface of the substrate 1 and gate electrodes 9A and 9B, is removed with hot phosphoric acid, and the surface of the substrate 1 ($n^+$-type semiconductor region 14 and $p^+$-type semiconductor region 15) and the surface of gate electrodes 9A and 9B are exposed. Then, a cobalt (Co) film 17a is deposited on the substrate 1 using a spattering technique, as shown in FIG. 15. Otherwise, a Ti (titanium) film may be deposited instead of the cobalt film 17a.

Subsequently, the substrate 1 is subjected to heat treatment to cause the cobalt film 17a to react with the silicon (substrate 1 and gate electrodes 9A and 9B), and then any unreacted cobalt film 17a is removed using wet-etching. As a result, a cobalt silicide layer 17 is formed on the surfaces of the $n^+$-type semiconductor region (source and drain) 14, $p^+$-type semiconductor region (source and drain) 15, and gate electrodes 9A and 9B, respectively, as shown in FIG. 16. The provision of the cobalt silicide layer 17 on the surfaces of gate electrodes 9A and 9B results in forming gate electrodes 9A and 9B as a laminate film (polyside film) composed of the polycrystalline silicon film (9a or 9b) and cobalt silicide layer 17.

Through the above-mentioned steps, an n-channel type MISFET ($Qn_1$) and a p-channel type MISFET ($Qp_1$), that are components of the internal circuit, and an n-channel type MISFET ($Qn_2$) and a p-channel type MISFET ($Qp_2$), that are components of the I/O circuit, are completed.

Figure 17:
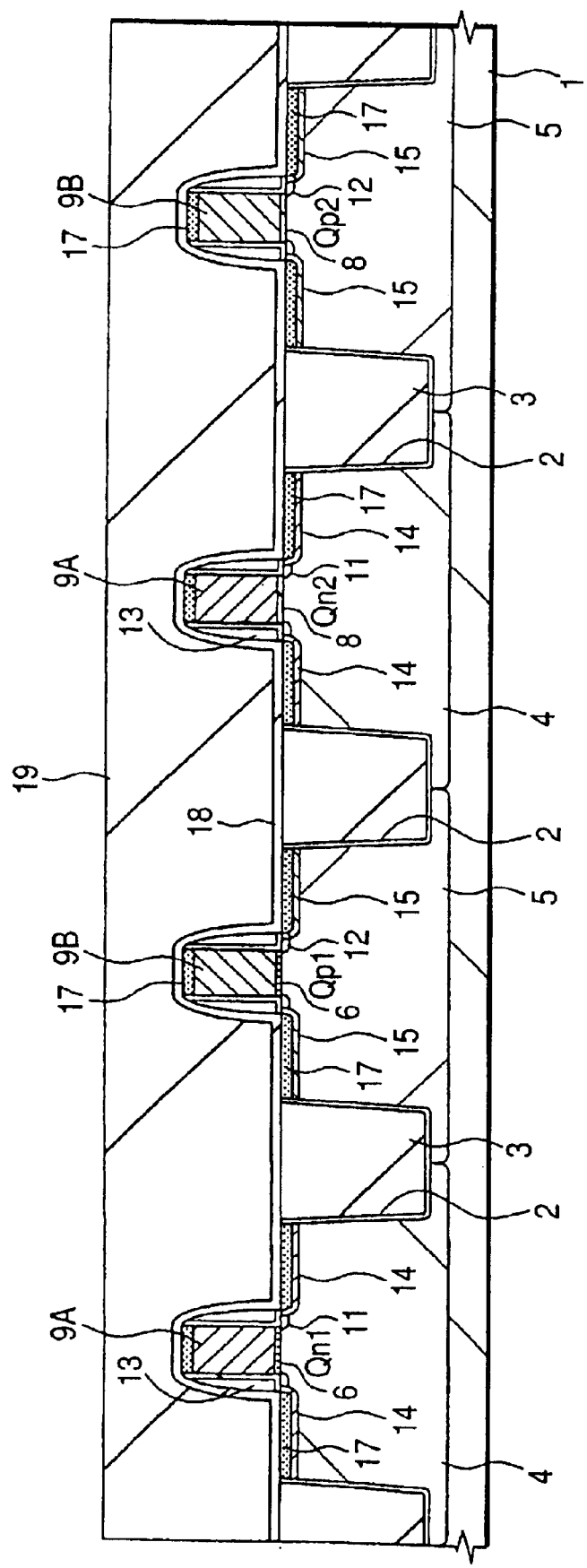
FIG. 17 is a partial cross-sectional view of the semiconductor substrate showing a subsequent step of the method of manufacture of the MISFET in accordance with one embodiment of the present invention.

Next, as shown in FIG. 17, a silicon film 18 is deposited on the substrate 1 by means of a CVD technique, and a silicon oxide film 19 is deposited on the silicon nitride film 18 using a CVD technique. A silicon oxide film 19 is deposited by means of a plasma CVD technique in which, for example, tetraethoxysilane and oxygen are used as a source gas (film forming temperature is about 400° C.). The silicon nitride film 18, that is located under the silicon oxide film 19, functions as a barrier layer for preventing the gate insulation film (titanium oxide film 6) from being oxidized due to the heat generated when the silicon oxide film 19 is deposited by use of a source gas containing oxygen. Furthermore, the silicon nitride film 18 also will function as an etching stopper film for preventing the silicon oxide film 3 in the element separation groove 2 from being removed too deeply in the next contact hole forming step.

Figure 18:
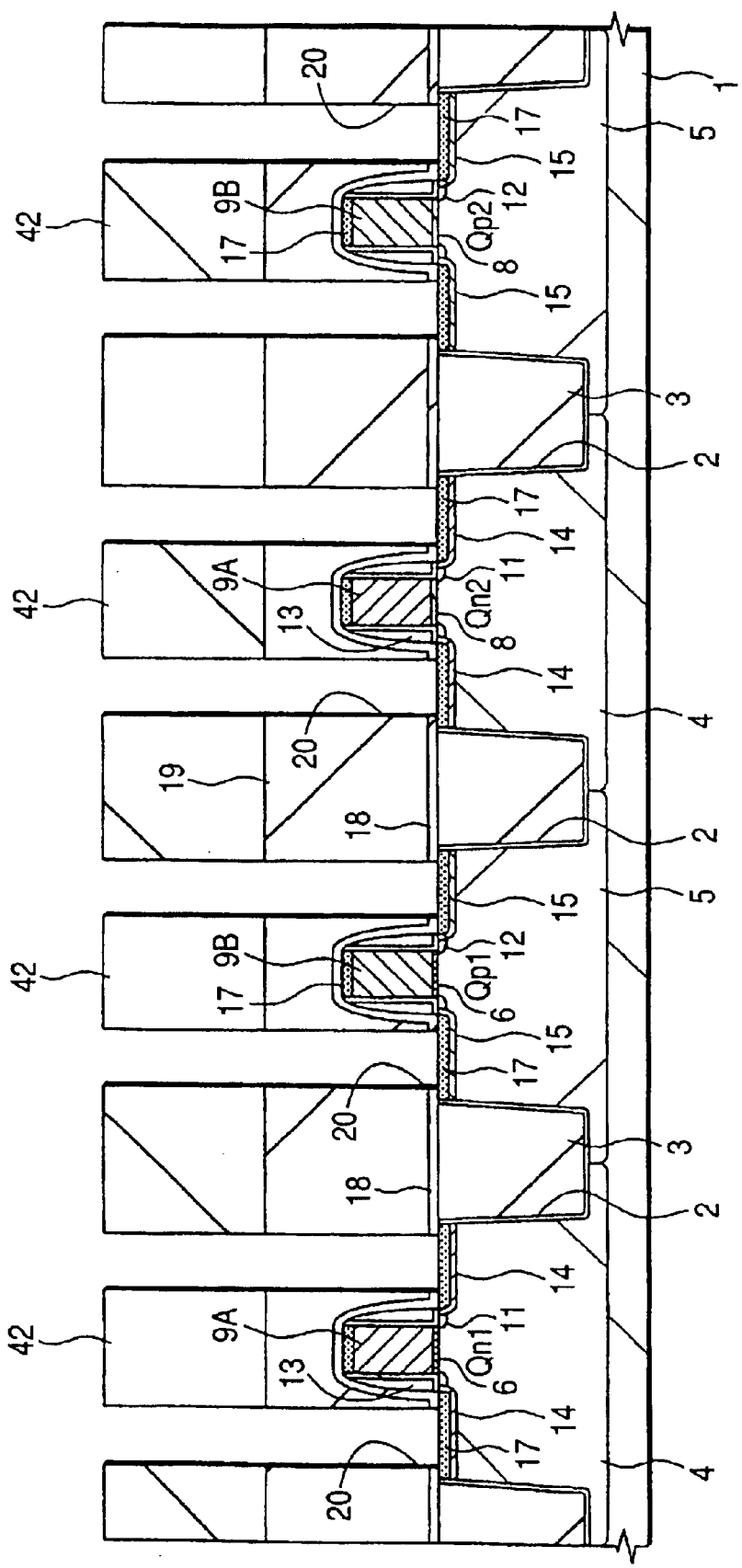
FIG. 18 is a partial cross-sectional view of the semiconductor substrate showing a subsequent step of the method of manufacture of the MISFET in accordance with one embodiment of the present invention.

Next, as shown in FIG. 18, the silicon oxide film 19 and the silicon nitride film 18, that is located under the silicon oxide film 19, are subjected to dry-etching using a photoresist film 42 formed on the silicon oxide film 19 as a mask, to thereby form contact holes 20 on the top of the $n^+$-type semiconductor region (source and drain) 14 and on the top of the $p^+$-type semiconductor region (source and drain) 15, respectively.

The dry-etching of the silicon oxide film 19 is carried out under the condition that the etching selectivity ratio to the silicon nitride film 18 located under the silicon oxide film 19 (and the sidewall spacer 13) is large, and the etching of the silicon nitride film 18 is carried out under the condition that the etching selectivity ratio to the silicon oxide film 3 in the element separation groove 2 is large. As a result, because the contact hole 20 is formed by self-alignment relative to the gate electrode 9A (9B) and silicon oxide film 3, respectively, removal of the gate electrode 9A (9B) and silicon oxide film 3 can be prevented, even though the contact hole 20 deviates from the gate electrode 9A (9B) and the contact hole 20 deviates from the element separation groove 2.

Next, the photoresist film 42 is removed by an ashing technique, a tungsten (W) film is deposited on the silicon oxide film 19, including the inside of the contact hole, by means of a CVD technique, or spattering technique as shown in FIG. 19, and the tungsten film is subjected to dry-etching using a photoresist film as a mask, to thereby form tungsten wirings 21 to 27 on the silicon oxide film 19.

Thereafter, a plurality of wiring layers are formed on the tungsten wirings 21 to 27 with interposition of interlayer insulation films, but the illustration of these wiring layers is omitted.

As described hereinabove, according to the present embodiment, the gate insulation film of the MISFET, that is a component of the internal circuit and is formed of a high dielectric film, brings about not only a suppression of the tunnel current, but also secures the driving capability of the MISFET. Furthermore, the gate insulation film of the MISFET, that is a component of the I/O circuit and is formed of a silicon oxide film, brings about a securing of the reliability of the MISFET.

(Embodiment 2)

At first, as shown in FIG. 20, gate electrodes 9A and 9B are formed on a gate insulation film consisting of the titanium oxide film 6 in the same manner as used in the method of embodiment 1, and the gate electrodes 9A and 9B, consisting of a silicon oxide film 8, are formed on the gate insulation film. The consecutive steps up to the above-mentioned step are the same as those carried out in the method of embodiment 1, as described with reference to FIG. 1 to FIG. 8.

Forming the gate electrodes 9A and 9B by etching the gate electrode material results in removal of the gate insulation film (titanium oxide film 6 and silicon oxide film 8) on the region other than that located under the gate electrodes 9A and 9B to some extent and also results in damage due to etching of the gate insulation film (titanium oxide film 6 and silicon oxide film 8) at the sidewall end of the gate electrodes 9A and 9B. Therefore, the above-mentioned removal of the gate insulation film and damage to the gate insulation film can result in a low withstand voltage of the gate insulation film (titanium oxide film 6 and silicon oxide film 8) and an increased leakage current of the gate insulation film (titanium oxide film 6 and silicon oxide film 8).

Figure 21:
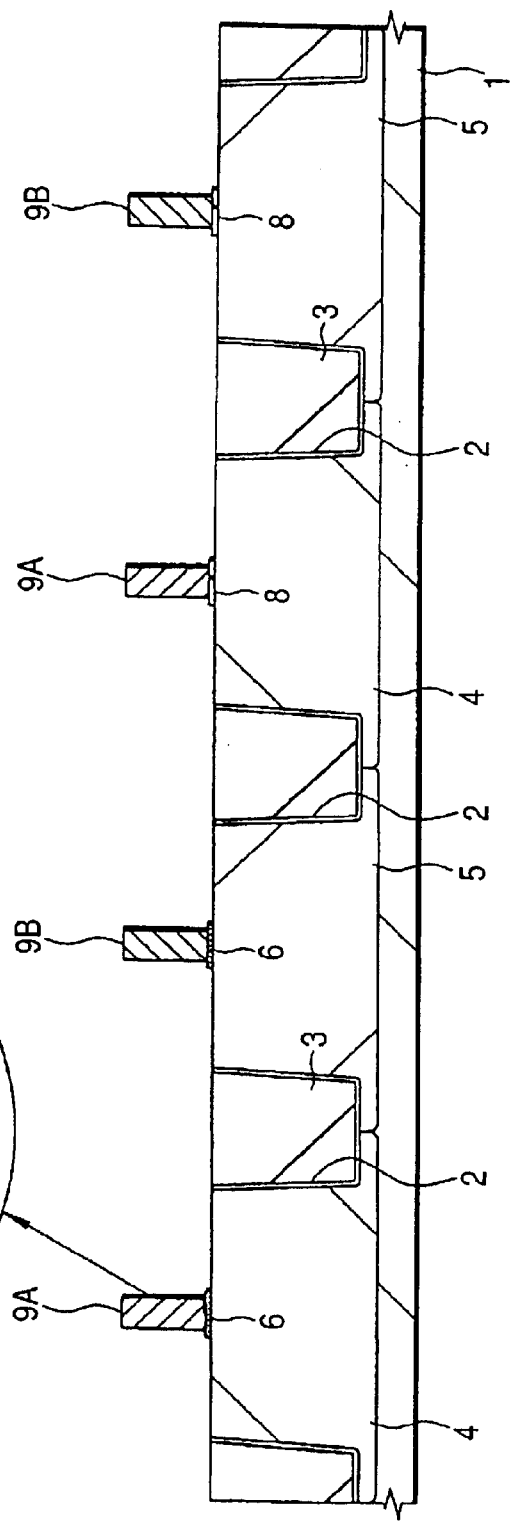
FIG. 21 is a partial cross-sectional view of the semiconductor substrate showing a subsequent step of the method of manufacture of the MISFET in accordance with the second embodiment of the present invention.

To solve the above-mentioned problems, the width of the gate electrodes 9A and 9B is narrowed (fine width electrode) after forming the gate electrodes 9A and 9B, as shown in FIG. 21, and the gate length is narrowed so that it is narrower than the width of the under gate insulation film (titanium oxide film 6 and silicon oxide film 8). To narrow the width of the gate electrodes 9A and 9B, the surface of the substrate 1 is subjected to wet-etching by use of, for example, a mixed aqueous solution of nitric acid ($HNO_3$) and hydrogen fluoride (HF).

Thereby, the portion (sidewall edges of the gate electrodes 9A and 9B before narrowing the width) that has been damaged during the above-mentioned etching of the gate insulation film (titanium oxide film 6 and silicon oxide film 8) is projected to the outside of the gate electrodes 9A and 9B and does not function substantially as the gate insulation film. In other words, only the portion that has not been damaged during etching for forming the gate electrodes 9A and 9B functions substantially as the gate insulation film, and so deterioration of the withstand voltage of the gate electrodes 9A and 9B and an increase in the leakage current of the gate insulation film (titanium oxide film 6 and silicon oxide film 8) are resultantly suppressed without the light oxidation that is carried out in the conventional gate forming process. Furthermore, because no light oxidation is carried out, this process does not cause the problem of reduced dielectric constant due to the forming of a silicon oxide film on the interface between the gate insulation film, consisting of the titanium oxide film 6, and the substrate 1.

Figure 22:
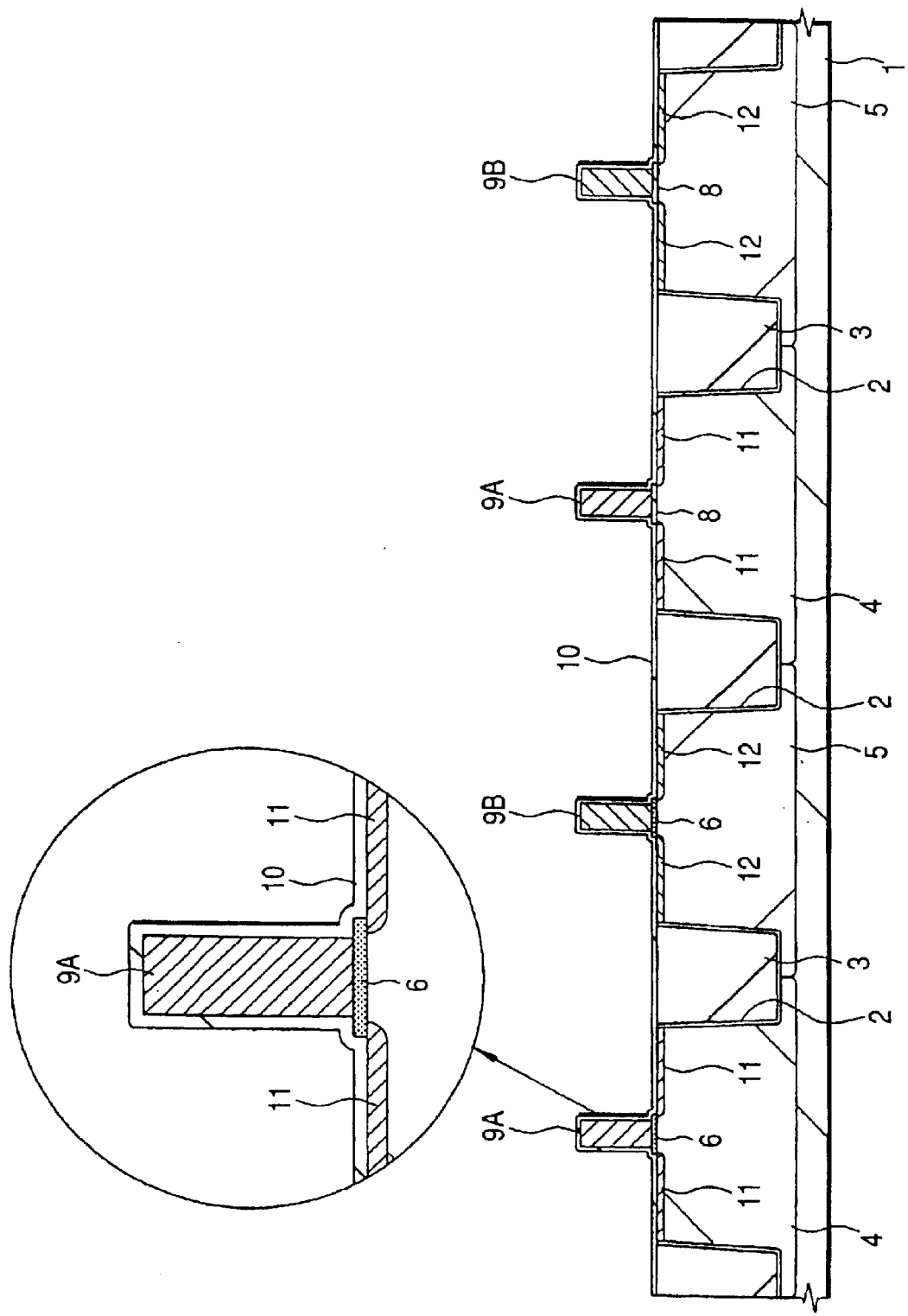
FIG. 22 is a partial cross-sectional view of the semiconductor substrate showing a subsequent step of the method of manufacture of the MISFET in accordance with the second embodiment of the present invention.

Next, as shown in FIG. 22, a silicon nitride film 10 is deposited on the substrate 1 by a CVD technique, and the p-type wells 4 on both sides of the gate electrode 9A are ion-implanted with phosphor or arsenic to form an n$^-$-type semiconductor region 11 of low impurity concentration, and the n-type wells on both sides of the gate electrodes 9B are ion-implanted with boron to form a p-type semiconductor region 12 of low impurity concentration. The following steps are the same as those carried out in the Imethod of embodiment 1.

The present invention has been described in detail hereinabove with reference to various embodiments, but, as a matter of course, the present invention is by no means limited to the above-mentioned embodiments and may be variously modified without departing from the sprit and the scope of the present invention.

The above-mentioned embodiments are directed to an exemplary structure in which the gate insulation film of the MISFET, that is a component of the internal circuit, is formed of a high dielectric constant film, and the gate insulation film of the MISFET, that is a component of the I/O circuit, is formed of a silicon oxide film; however, the present invention is by no means limited to the above-mentioned structure, and the present invention may be applied widely to a two-type gate process for forming the gate insulation film of a MISFET partially formed of a high dielectric constant film.

The representative aspects of the invention disclosed in the present application bring about the following effects, and the effects are described briefly hereinunder.

A part of a gate insulation film of the MISFET formed of a high dielectric film brings about not only suppression of the tunnel current, but also maintains the driving capability of the MISFET. The other part of gate insulation film formed of a silicon oxide film secures the reliability of the MISFET.

It is possible in accordance with the present invention to suppress a deterioration of the withstand voltage of the gate electrode and an increase in the leakage current of the gate insulation film.

What is claimed is:

1. A semiconductor integrated circuit device comprising:
   a first MISFET on a first region of a main surface of a semiconductor substrate; and
   a second MISFET on a second region of the main surface of the semiconductor substrate,
   wherein the first MISFET has a first sidewall spacer formed over the sidewall of a first gate electrode, of the first MISFET,
   wherein the first MISFET has a silicon nitride film formed between the first sidewall spacer and the first gate electrode,
   wherein a gate insulation film of the first MISFET comprises a first insulation film having a relative dielectric constant higher than that of silicon nitride,
   wherein a gate insulation film of the second MISFET comprises a second insulation film including silicon oxide, and
   wherein a film thickness, converted to that of a silicon oxide film, of the first insulation film is thinner than a film thickness, converted to that of a silicon oxide film, of the second insulation film.

2. A semiconductor integrated circuit device according to claim 1, wherein the film thickness, converted to that of a silicon oxide film, of the first insulation film is thinner than 3 nm; and the film thickness, converted to that of a silicon oxide film, of the second insulation film is equal to or thicker than 3 nm.

3. A semiconductor integrated circuit device according to claim 1, wherein the first insulation film consists of an oxide of a 4A group element.

4. A semiconductor integrated circuit device according to claim 1, further comprising a silicon nitride film that covers the first sidewall spacer, formed on a sidewall of a gate electrode of the first MISFET.

5. A semiconductor integrated circuit device according to claim 1, wherein said silicon nitride film formed between the first sidewall spacer and the first gate electrode extends along a side of the gate insulation film of the first MISFET.

6. A semiconductor integrated circuit device according to claim 1, further comprising first impurity regions formed in the semiconductor substrate on both sides of the first gate electrode.

7. A semiconductor integrated circuit device according to claim 6, further comprising second impurity regions formed in the semiconductor substrate on both sides of the first sidewall spacer, and the impurity concentration of the second impurity regions is higher than that of the first impurity regions.

8. A semiconductor integrated circuit device according to claim 1, wherein the second MISFET operates with higher voltage than the first MISFET.

9. A semiconductor integrated circuit device according to claim 8, wherein the first MISFET is included in an internal circuit.

10. A semiconductor integrated circuit device according to claim 8, wherein the second MISFET is included in an I/O circuit.

11. A semiconductor integrated circuit device according to claim 1, wherein the first insulation film includes one of a titanium oxide film, a zirconium oxide film, a hafnium oxide film, and a tantalum oxide film.

12. A semiconductor integrated circuit device according to claim 1, wherein, in a gate length direction, the length of the first gate electrode of the first MISFET is narrower than the length of the gate insulation film of the first MISFET.

13. A semiconductor integrated circuit device comprising:
a first MISFET on a first region of a main surface of a semiconductor substrate; and
a second MISFET on a second region of the main surface of the semiconductor substrate,
wherein a gate insulation film of the first MISFET comprises a first insulation film having a relative dielectric constant higher than that of silicon nitride,
wherein a gate insulation film of the second MISFET comprises a second insulation film including silicon oxide,
wherein, in a gate length direction, the length of the first gate electrode of the first MISFET is narrower than the length of the first gate insulation film, and
wherein a film thickness, converted to that of a silicon oxide film, of the first insulation film is thinner than a film thickness, converted to that of a silicon oxide film, of the second insulation film.

14. A semiconductor integrated circuit device according to claim 13, wherein the film thickness, converted to that of a silicon oxide film, of the first insulation film is thinner than 3 nm; and the film thickness, converted to that of a silicon oxide film, of the second insulation film is equal to or thicker than 3 nm.

15. A semiconductor integrated circuit device according to claim 13, wherein the first insulation film consists of an oxide of a 4A group element.

16. A semiconductor integrated circuit device according to claim 13, further comprising a sidewall spacer, comprising (a) a silicon nitride film or (b) a silicon oxide film and a silicon nitride film that covers the silicon oxide film, formed on a sidewall of a gate electrode of the first MISFET.

17. A semiconductor integrated circuit device according to claim 13, wherein the second MISFET operates with higher voltage than the first MISFET.

18. A semiconductor integrated circuit device according to claim 17, wherein the first MISFET is included in an internal circuit.

19. A semiconductor integrated circuit device according to claim 17, wherein the second MISFET is included in an I/O circuit.

20. A semiconductor integrated circuit device according to claim 13, wherein the first insulation film includes one of a titanium oxide film, a zirconium oxide film, a hafnium oxide film, and a tantalum oxide film.

21. A semiconductor integrated circuit device comprising:
a first MISFET on a first region of a main surface of a semiconductor substrate; and
a second MISFET on a second region of the main surface of the semiconductor substrate,
wherein the first MISFET has a first sidewall spacer formed over the sidewall of a first gate electrode, of the first MISFET,
wherein the first MISFET has a silicon nitride film formed between the first sidewall spacer and the first gate electrode,
wherein a gate insulation film of the first MISFET comprises a first insulation film having a relative dielectric constant higher than 8,
wherein a gate insulation film of the second MISFET comprises a second insulation film including silicon oxide, and
wherein a film thickness, converted to that of a silicon oxide film, of the first insulation film is thinner than a film thickness, converted to that of a silicon oxide film, of the second insulation film.

22. A semiconductor integrated circuit device according to claim 21, wherein the second MISFET operates with higher voltage than the first MISFET.

23. A semiconductor integrated circuit device according to claim 21, wherein the first insulation film includes one of a titanium oxide film, a zirconium oxide film, a hafnium oxide film, and a tantalum oxide film.

24. A semiconductor integrated circuit device according to claim 21, wherein, in a gate length direction, the length of the first gate electrode of the first MISFET is narrower than the length of the gate insulation film of the first MISFET.

25. A semiconductor integrated circuit device comprising:
a first MISFET on a first region of a main surface of a semiconductor substrate; and
a second MISFET on a second region of the main surface of the semiconductor substrate,
wherein a gate insulation film of the first MISFET comprises a first insulation film having a relative dielectric constant higher than 8,
wherein a gate insulation film of the second MISFET comprises a second insulation film including silicon oxide,
wherein, in a gate length direction, the length of the first gate electrode of the first MISFET is narrower than the length of the first gate insulation film, and
wherein a film thickness, converted to that of a silicon oxide film, of the first insulation film is thinner than a film thickness, converted to that of a silicon oxide film, of the second insulation film.

26. A semiconductor integrated circuit device according to claim 25, wherein the second MISFET operates with higher voltage than the first MISFET.

27. A semiconductor integrated circuit device according to claim 25, wherein the first insulation film includes one of a titanium oxide film, a zirconium oxide film, a hafnium oxide film, and a tantalum oxide film.

* * * * *